United States Patent
Suzuki et al.

(10) Patent No.: US 8,324,644 B2
(45) Date of Patent: Dec. 4, 2012

(54) OPTICAL FUNCTIONAL ELEMENT, OPTICAL FUNCTIONAL ELEMENT ARRAY, EXPOSURE DEVICE, AND METHOD OF MANUFACTURING OPTICAL FUNCTIONAL ELEMENT

(75) Inventors: Teiichi Suzuki, Tokyo (JP); Hideki Fukunaga, Kanagawa (JP); Akira Fujii, Kanagawa (JP); Takashi Fujimoto, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 365 days.

(21) Appl. No.: 12/726,869

(22) Filed: Mar. 18, 2010

(65) Prior Publication Data

US 2011/0062463 A1 Mar. 17, 2011

(30) Foreign Application Priority Data

Sep. 14, 2009 (JP) ................................. 2009-211726

(51) Int. Cl.
*H01L 29/22* (2006.01)
*H01L 29/16* (2006.01)

(52) U.S. Cl. ............................... 257/98; 257/83; 257/84

(58) Field of Classification Search .................... 257/14, 257/83, 84, 91, 98, E21.614, E33.067, E33.069
See application file for complete search history.

(56) References Cited

U.S. PATENT DOCUMENTS

| | | | | |
|---|---|---|---|---|
| 7,381,581 B2 * | 6/2008 | Suzuki et al. | ................... | 438/32 |
| 7,884,386 B2 * | 2/2011 | Masui et al. | ................... | 257/98 |
| 2003/0043254 A1 | 3/2003 | Noguchi et al. | | |
| 2007/0246723 A1 * | 10/2007 | Moriya et al. | ................... | 257/98 |

FOREIGN PATENT DOCUMENTS

| | | |
|---|---|---|
| JP | 2-263668 A | 10/1990 |
| JP | 2001-189526 A | 7/2001 |
| JP | 2003-078160 A | 3/2003 |
| JP | 2003-249680 A | 9/2003 |

* cited by examiner

*Primary Examiner* — Hung Vu
(74) *Attorney, Agent, or Firm* — Sughrue Mion, PLLC

(57) ABSTRACT

According to an aspect of the invention, an optical functional element includes a substrate, a semiconductor element portion, and a light emitting element portion. The semiconductor element portion includes a first part of a semiconductor multi layer structure formed on the substrate. The light emitting element portion includes a second part of the semiconductor multi layer structure and light emitting element structure formed on the second part of the semiconductor multi layer structure.

5 Claims, 5 Drawing Sheets

OPTICAL FUNCTIONAL ELEMENT, OPTICAL FUNCTIONAL ELEMENT ARRAY, EXPOSURE DEVICE, AND METHOD OF MANUFACTURING OPTICAL FUNCTIONAL ELEMENT

CROSS-REFERENCE TO RELATED APPLICATIONS

This application is based upon and claims priority under 35 USC 119 from Japanese Patent Application No. 2009-211726, filed Sep. 14, 2009.

BACKGROUND

1. Technical Field

The present invention relates to an optical functional element, an optical functional element array, an exposure device, and a manufacturing method for the optical functional element.

2. Related Art

A self-scanning light emitting element array is known in which semiconductor elements and light emitting elements as optical functional elements are integrally formed and they are arranged in a 1-dimensional shape.

SUMMARY

According to an aspect of the invention, an optical functional element includes a substrate, a semiconductor element portion, and a light emitting element portion. The semiconductor element portion includes a first part of a semiconductor multi layer structure formed on the substrate. The light emitting element portion includes a second part of the semiconductor multi layer structure and light emitting element structure formed on the second part of the semiconductor multi layer structure.

BRIEF DESCRIPTION OF THE DRAWINGS

Exemplary embodiments of the invention will be described in detail based on the following figures, wherein.

DETAILED DESCRIPTION

Figure 1:
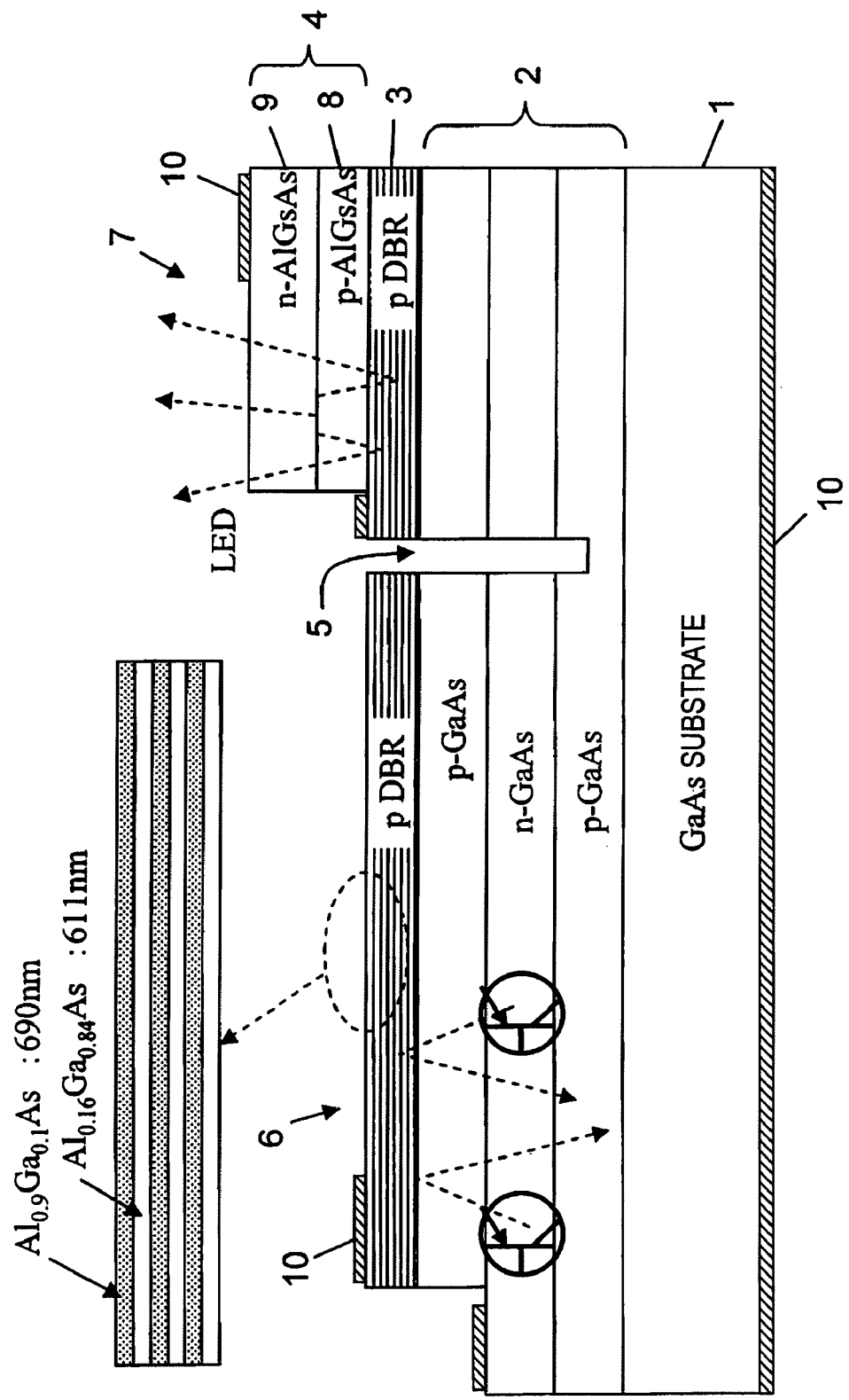
FIG. 1 is a diagram illustrating an optical functional element according to an exemplary embodiment of the invention.

FIG. 1 is a diagram illustrating an optical functional element according to an exemplary embodiment of the invention. As shown in FIG. 1, the optical functional element of the exemplary embodiment is provided with a substrate 1, a semiconductor element portion 6, and a light emitting element portion 7. The semiconductor element portion 6 is formed a first part of a semiconductor multi layer structure having a semiconductor element structure 2 formed by laminating a p-type semiconductor layer and an n-type semiconductor layer in order of npn or pnp on the substrate 1, a light reflective layer 3 formed by alternately laminating semiconductor layers with different refractive indexes on the side of the semiconductor element structure 2 opposite to the substrate 1 side, and the semiconductor multi layer structure is divided by a groove 5 formed in a cross direction of the laminated face. The light emitting element portion 7 is formed by laminating a light emitting element structure 4 on the light reflective layer 3 at a second part of the semiconductor multi layer structure divided by the groove 5.

The substrate 1 is, for example, a GaAs substrate, and the semiconductor element structure 2 is formed of, for example, a laminated structure of a p-type GaAs layer, an n-type GaAs layer, and a p-type GaAs layer, but they are not limited thereto. The light reflective layer 3 is a so-called distributed Bragg reflector (DBR) formed by alternately laminating p-type semiconductor layers $Al_{0.9}Ga_{0.1}As$ (e.g., thickness: 69.0 nm) and $Al_{0.16}Ga_{0.84}As$ (e.g., thickness: 61.1 nm), which have different refractive indexes. The semiconductor element portion 6 is formed at the first part of the semiconductor multi layer structure divided by the groove 5. The light emitting element portion 7 is formed at the second part of the semiconductor multi layer structure divided by the groove 5. In the exemplary embodiment shown in FIG. 1, the semiconductor element portion 6 constitutes transistors, and a logic circuit is formed by using the transistors. In the exemplary embodiment, the light emitting element portion 7 forms a light emitting diode (LED) as the light emitting element structure 4 by pn junction of a p-type $Al_{0.3}Ga_{0.7}As$ layer 8 and an n-type $Al_{0.3}Ga_{0.7}As$ layer 9 on the light reflective layer 3. Electrodes 10 are formed on the semiconductor element portion 6, the GaAs substrate, and the light emitting element portion 7, respectively.

In such a kind of optical functional element, light is generated at the pn junction portion formed in the semiconductor element portion 6 as well as the light emitting element portion 7 during an operation. Light with a wavelength of, for example, 850 nm is generated at the pn junction portion. In the exemplary embodiment, as shown in FIG. 1 by the broken line, unnecessary light generated in the semiconductor element portion 6 is reflected from the light reflective layer 3 toward the substrate 1, and thus leakage of light out of the element in an upward direction of FIG. 1 is suppressed. Necessary light generated in the light emitting element portion 7 is reflected from the light reflective layer 3, and thus light escaping toward the substrate 1 is decreased. The above structure improves an output efficiency of light.

Hereinafter, an example of a manufacturing method for the optical function element according to the exemplary embodiment will be described. First, the substrate 1 is prepared, and the p-type semiconductor layer and the n-type semiconductor layer are grown on the substrate 1 in order of npn or pnp to form the semiconductor element structure 2. The semiconductor layers with different refractive indices are alternately grown on the side of the semiconductor element layer 2 opposite to the substrate 1 side to form the light reflective layer 3. The light emitting element structure 4 is grown on the light reflective layer 3. The light emitting element laminated structure having the semiconductor element structure 2, the light reflective layer 3, and the light emitting element structure 4 is divided by forming the groove 5 so as to form a part as the semiconductor element portion 6 and the other part as the light emitting element portion 7. The light emitting element structure 4 on the light emitting element portion 7 is kept on the light reflective layer 3. The light emitting element structure 4 on the semiconductor element portion 6 is removed.

For example, the multi layer structure of a p-type GaAs layer, an n-type GaAs layer, and a p-type GaAs layer is epitaxially grown as the semiconductor element structure 2 on the GaAs substrate 1. P-type $Al_{0.9}Ga_{0.1}As$ (e.g., thickness: 69.0 nm) and $Al_{0.16}Ga_{0.84}As$ (e.g., thickness: 61.1 nm) whose refractive index is difference from refractive index of the p-type $Al_{0.9}Ga_{0.1}As$ are alternately epitaxially grown as the light reflective layer 3 on the epitaxially grown layer, for example, in a period of about 40, and a distributed Bragg reflector (DBR) is formed. A p-type $Al_{0.3}Ga_{0.7}As$ layer and an n-type $Al_{0.3}Ga_{0.7}As$ layer are epitaxially grown on the light reflective layer 3 to form the light emitting element structure 4. The groove 5 is formed by etching to divide the structure and a part as the semiconductor element portion 6 and the other part as the light emitting element portion 7 are formed. A part of the light emitting element structure 4 is used as the light emitting element portion 7. The light emitting element structure 4 formed on the part used as the semiconductor element portion 6 is removed by etching. The electrodes 10 are formed on the portions as necessary, respectively. Materials and thicknesses of the semiconductor layers used in the exemplary embodiment are example, which are not limited thereto. The manufacturing method is not limited thereto, for example, a method of removing the light emitting element structure 4 from the part used as the semiconductor element portion 6 and then forming the groove 5 may be employed.

Figure 2:
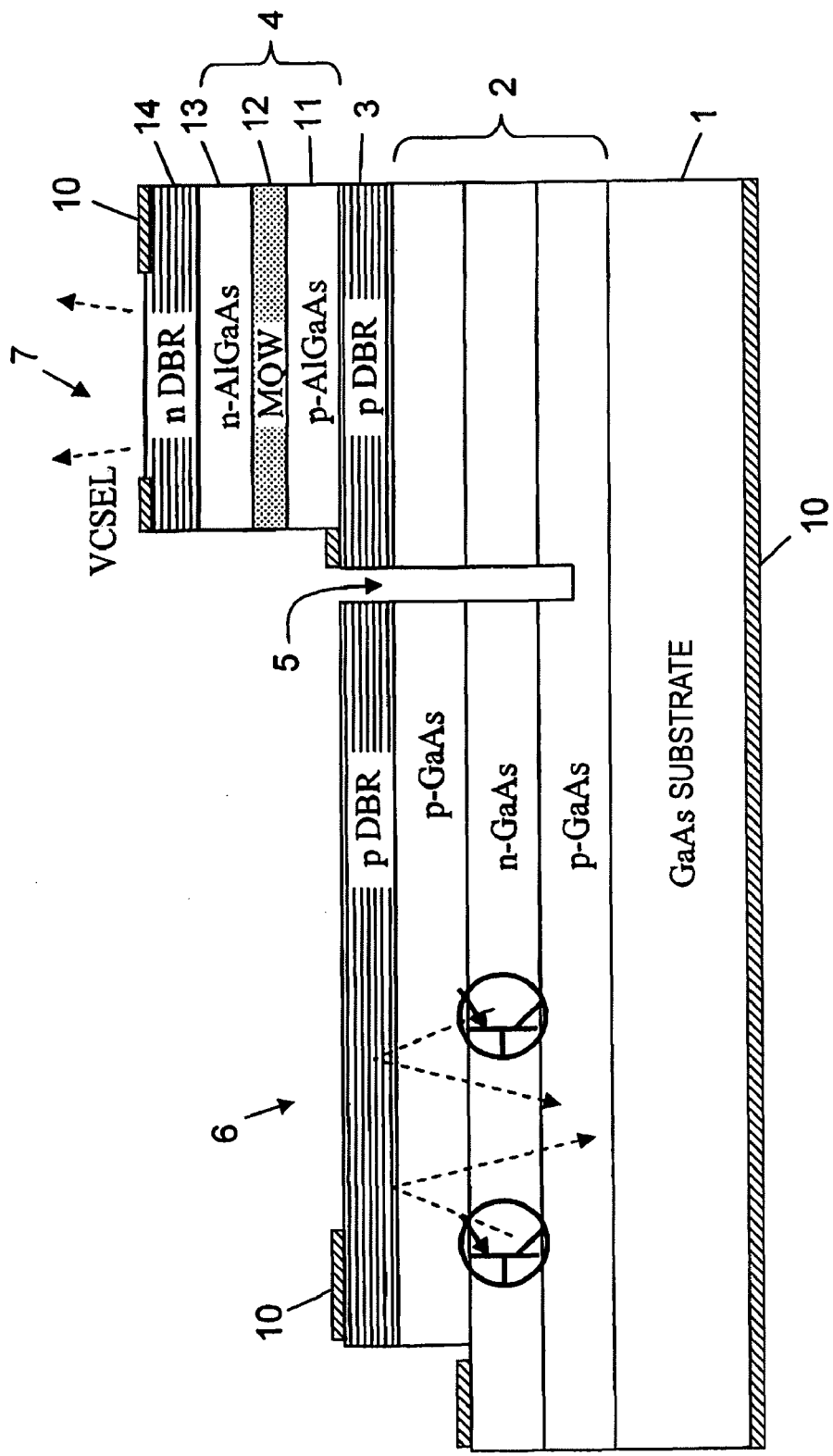
FIG. 2 is a diagram illustrating an optical functional element according to another exemplary embodiment of the invention.

FIG. 2 is a diagram illustrating an optical functional element according to another exemplary embodiment of the invention. The exemplary embodiment is different from the exemplary embodiment shown in FIG. 1 in that the light emitting element portion 7 is not formed of the LED but vertical cavity surface emitting laser (VCSEL), and the others are the same as the exemplary embodiment shown in FIG. 1. For example, as shown in FIG. 2, the light emitting element portion 7 is formed by laminating a p-type $Al_{0.3}Ga_{0.7}As$ layer 11, a multiple quantum well (MQW) active layer 12 of GaAs and $Al_{03}Ga_{0.7}As$, and an n-type $Al_{0.3}Ga_{0.7}As$ layer 13 as the light emitting element structure 4 on the light reflective layer 3, and forming the other light reflective layer 14 thereon. All the p-type $Al_{0.3}Ga_{0.7}As$ layer 11, the multiple quantum well (MQW) active layer 12 of GaAs and $Al_{0.3}Ga_{0.7}As$, and the n-type $Al_{0.3}Ga_{0.7}As$ layer 13 are called lambda cavity, and the thickness thereof becomes a thickness L (optical length) of a oscillation wavelength (1 wavelength). In this case, the optical length is represented by $L=\lambda/n$ and denotes a wavelength in crystal (medium), and $\lambda$ denotes an oscillation wavelength (wavelength observed when VCSEL oscillates) in vacuum. When the materials are employed as described in the exemplary embodiment, it oscillates at 850 nm that is a band gap of GaAs. For example, the light reflective layer 14 is a so-called distributed Bragg reflector (DBR) formed by alternately laminating an n-type semiconductor layer $Al_{0.9}Ga_{0.1}As$ (e.g., thickness: 69.0 nm) and $Al_{0.16}Ga_{0.84}As$ (e.g., thickness: 61.1 nm) which have different reflective indexes. A resonator is formed by the light reflective layer 3 and the light reflective layer 14. The laser light generated in the active layer 12 can be taken out from the light reflective layer 14 side through the resonator as shown in FIG. 2 by the broken arrows by allowing a reflectance of the light reflective layer 3 to be higher than a reflectance of the light reflective layer 14 (e.g., DBR (p-type) of the light reflective layer 3 consist of about 40 period, and DBR (n-type) of the light reflective layer 14 consist of about 30 period).

Figure 3:
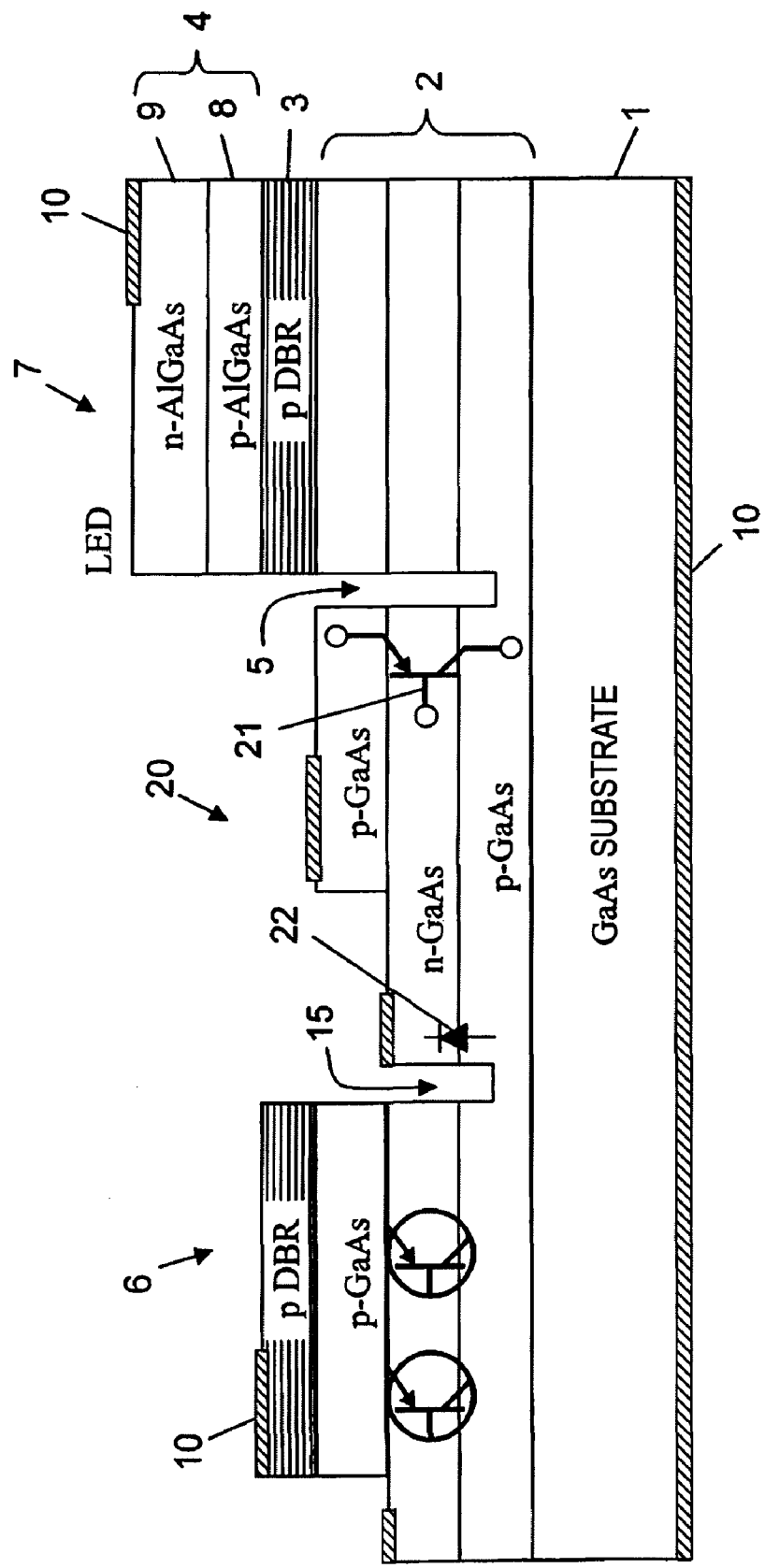
FIG. 3 is a diagram illustrating an optical functional element according to still another exemplary embodiment of the invention.

FIG. 3 is a diagram illustrating an optical functional element according to still another exemplary embodiment of the invention. The exemplary embodiment is different from the exemplary embodiment shown in FIG. 1 in that a light detection portion (hereinafter, referred to as an optical sensor portion) 20 is formed by removing the light reflective layer 3, or the light reflective layer 3 and the semiconductor layer adjacent thereto, at a third part formed by dividing the semiconductor multi layer structure by a groove 15 other than the groove 5, and the others are the same as the exemplary embodiment shown in FIG. 1. As shown in FIG. 3, as the optical sensor portion 20, a photo transistor 21 formed of a p-type GaAs layer, an n-type GaAs layer, and a p-type GaAs layer can be formed by removing the light reflective layer 3. In this case, the photo transistor 21 is operated by incident light in a base (n-GaAs layer), and an electric current is amplified. In addition, a photo diode 22 formed of an n-type GaAs layer and a p-type GaAs layer can be formed by removing the light reflective layer 3 and the p-type GaAs layer adjacent thereto. Optical power (leakage light) from the light emitting element portion 7 is monitored by the photo transistor 21 or the photo diode 22. In addition to the monitoring of the optical power of the light emitting element portion 7, light intensity from the outside is monitored.

Figure 4:
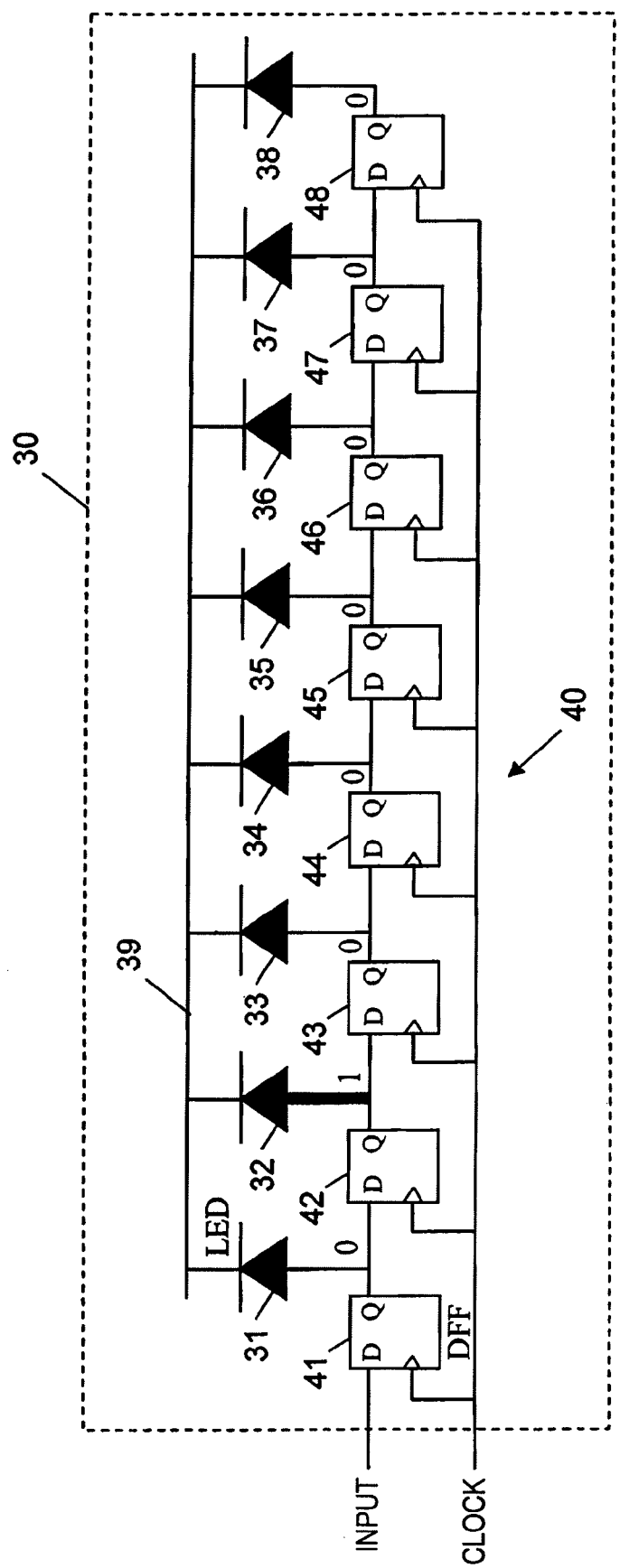
FIG. 4 is a connection diagram illustrating an optical functional element row according to an exemplary embodiment of the invention.

FIG. 4 is a connection diagram illustrating an optical functional element array according to an exemplary embodiment of the invention. The optical functional element array is formed by arranging the optical functional elements shown in FIG. 1, FIG. 2, or FIG. 3, in a 1-dimensional or 2-dimensional shape. In the exemplary embodiment, as shown in FIG. 4, a plurality of the optical functional elements according to the exemplary embodiment shown in FIG. 1 are arranged in the 1-dimensional shape. The optical functional element array 30 has, for example, LEDs 31 to 38 as the light emitting element portions and has D flip-flops (DFF) 41 to 48 as the semiconductor element portions, but is not limited thereto. The flip-flops can be configured as logic circuits using a plurality of transistors formed in the semiconductor element portions. An 8-bit shift register 40 is configured as a driving circuit of the LEDs using the DFFs 41 to 48. In the DFFs 41 to 48, a state of input D at a rising edge of clock is output as an output Q. The output Q is not varied at a part other than the rising edge of clock. In the exemplary embodiment shown in FIG. 4, the LED 32 is selected by the shift register 40. A signal (e.g., image signal) applied to a line 39 becomes Low when the LED is allowed to emit light, and the signal become High when the LED is not allowed to emit light. Accordingly, in the state of the shift register 40 shown in FIG. 4, when the signal applied to the line 39 is Low, the LED 32 emits light. On the contrary, when the signal is High, the LED 32 does not emit light.

Figure 5:
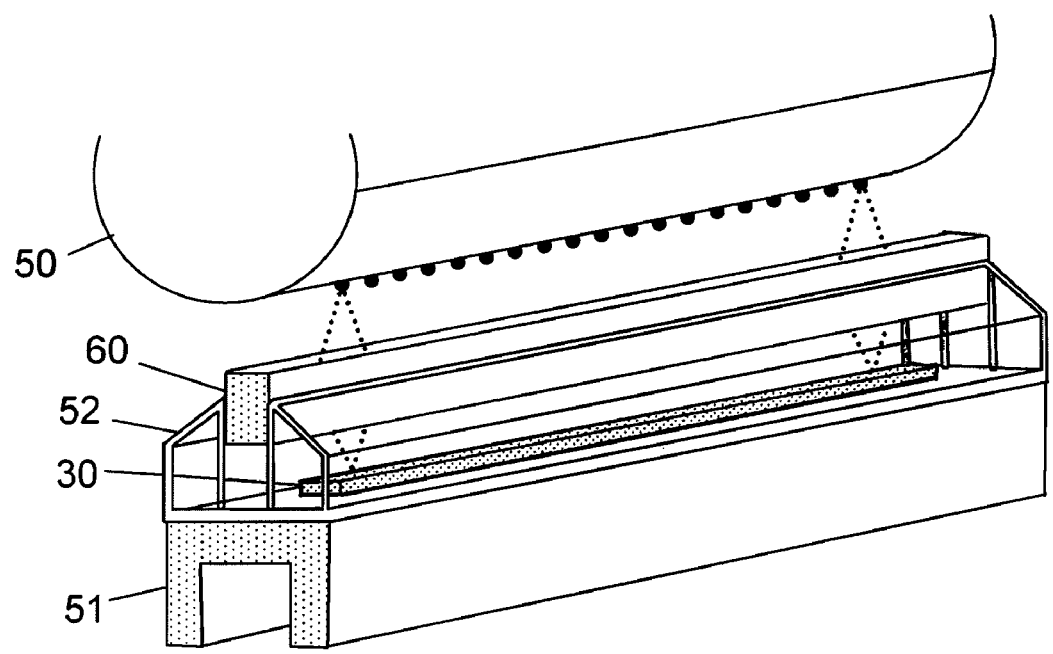
FIG. 5 is a diagram illustrating an exposure device for an image forming apparatus according to an exemplary embodiment of the invention.

FIG. 5 is a diagram illustrating an exposure device (hereinafter, referred to as print head) for an image forming apparatus according to an exemplary embodiment of the invention. The printing head is provided with the optical functional element array 30 shown in FIG. 4 and, for example, a SEL-FOC (registered trademark) lens array (SLA) 60 as an optical element which leads light emitted from the optical functional element array 30 to a photoreceptor 50 for an image forming apparatus. As shown in FIG. 5, the optical functional element array 30 is supported on a supporter 51. The SLA 60 is held by a holder 52. The holder 52 is shown so as to see the optical functional element array 30 surrounded by the holder 52. As shown in FIG. 5 by the broken lines, the optical functional element array 30 allows the LEDs to emit light on the basis of image information, the light is transmitted to the photoreceptor 50 through the SLA 60, and thus the image forming apparatus forms an image.

The foregoing description of the exemplary embodiment of the present invention has been provided for the purpose of illustration and description. It is not intended to be exhaustive or to limit the invention to the precise forms disclosed. Obviously, many modifications and various will be apparent to practitioners skilled in the art. The exemplary embodiments were chosen and described in order to best explain the principles of the invention and its practical application, thereby enabling other skilled in the art to understand the invention for various exemplary embodiments and with the various modifications as are suited to the particular use contemplated. It is intended that the scope of the invention be defined by the following claims and their equivalents.

What is claimed is:

1. An optical functional element comprising:
    a substrate;
    a semiconductor element portion that includes a first part of a semiconductor multi layer structure formed on the substrate; and
    a light emitting element portion that includes a second part of the semiconductor multi layer structure and light emitting element structure formed on the second part of the semiconductor multi layer structure,
    wherein the semiconductor multi layer structure includes a semiconductor element structure formed by p-type semiconductor layer and n-type semiconductor layer in order of npn or pnp on the substrate and a light reflective layer formed of alternating layers of a first semiconductor layer and a second semiconductor layer on a side of the semiconductor element structure opposite to the substrate,
    a refractive index of the first semiconductor layer is differ from a refractive index of the second semiconductor layer, and
    the semiconductor multi layer structure is divided into the first part and the second part by a groove formed in a cross direction of a grown face of the semiconductor multi layer structure.

2. The optical functional element according to claim 1, wherein the light emitting element portion has an active layer generating laser light, and has a second light reflective layer formed of alternating layers of a third semiconductor layer and a fourth semiconductor layer on a side opposite to the light reflective layer side, to form a resonator between the light reflective layer and the second light reflective layer, and
    a refractive index of the third semiconductor layer is differ from a refractive index of the fourth semiconductor layer.

3. The optical functional element according to claim 2, a refractive index of the light reflective layer is higher than a refractive index of the second light reflective layer.

4. The optical functional element according to claim 1, further comprising a light detection portion formed by removing the light reflective layer from a third part of the semiconductor multi layer structure or removing the light reflective layer of the third part and the semiconductor layer adjacent to the light reflective layer of the third part,
    wherein the semiconductor multilayer structure is divided into the first part, the second part, and the third part by the groove and a second groove each formed in a cross direction of the laminated face of the semiconductor laminated structure.

5. An optical functional element array comprising a plurality of optical functional elements arranged in 1-dimension or 2-dimension, each of the optical functional element including:
    a substrate;
    a semiconductor element portion that includes a first part of a semiconductor multi layer structure formed on the substrate; and
    a light emitting element portion that includes a second part of the semiconductor multi layer structure and light emitting element structure formed on the second part of the semiconductor multi layer structure,
    wherein the semiconductor multi layer structure includes a semiconductor element structure formed of p-type semiconductor layer and n-type semiconductor layer in order of npn or pnp on the substrate and a light reflective layer formed of alternating layers of a first semiconductor layer and a second semiconductor layer on a side of the semiconductor element structure opposite to the substrate,
    a refractive index of the first semiconductor layer is differ from a refractive index of the second semiconductor layer, and
    the semiconductor multi layer structure is divided into the first part and the second part by a groove formed in a cross direction of a grown face of the semiconductor multi layer structure.

* * * * *